US009278577B2

(12) United States Patent
Hicks

(10) Patent No.: US 9,278,577 B2
(45) Date of Patent: Mar. 8, 2016

(54) DECORATIVE COVERINGS

(71) Applicant: ARTSCAPE, INC., Portland, OR (US)

(72) Inventor: Thomas Hicks, Portland, OR (US)

(73) Assignee: Artscape, Inc., Portland, OR (US)

( * ) Notice: Subject to any disclaimer, the term of this patent is extended or adjusted under 35 U.S.C. 154(b) by 0 days.

(21) Appl. No.: 14/081,228

(22) Filed: Nov. 15, 2013

(65) Prior Publication Data

US 2015/0140270 A1 May 21, 2015

(51) Int. Cl.

| | |
|---|---|
| ***B32B 27/00*** | (2006.01) |
| ***B32B 27/36*** | (2006.01) |
| ***B32B 27/32*** | (2006.01) |
| ***B32B 27/08*** | (2006.01) |
| ***C23C 16/26*** | (2006.01) |
| ***B32B 5/26*** | (2006.01) |
| ***D04H 1/42*** | (2012.01) |
| ***C08J 5/18*** | (2006.01) |
| ***B31F 1/07*** | (2006.01) |
| ***B44F 5/00*** | (2006.01) |
| ***B44C 1/10*** | (2006.01) |

(Continued)

(52) U.S. Cl.

CPC . *B44F 5/00* (2013.01); *B44C 1/105* (2013.01); *B44C 3/025* (2013.01); *B44F 1/045* (2013.01); *B44F 9/04* (2013.01); *E04F 15/08* (2013.01); *Y10T 156/10* (2015.01); *Y10T 428/24355* (2015.01); *Y10T 428/24364* (2015.01)

(58) Field of Classification Search

CPC ..... G03H 1/20; G03H 1/202; G03H 2222/18; G03H 2210/562; G03H 1/041; G03H 2001/184; G03H 2001/0415; G03H 2210/22; G03H 2210/55; G03H 2223/19; G03H 2210/52; G03H 2001/2615; G03H 1/268; G03H 2001/0417; G03H 2210/54; B44C 1/105; B44C 3/025; B44F 1/045; B44F 5/00; B44F 9/04; E04F 15/08; B32B 27/00

USPC .................................. 428/156, 212–220, 142

See application file for complete search history.

(56) References Cited

U.S. PATENT DOCUMENTS

| | | | |
|---|---|---|---|
| 2,013,472 | A | 9/1935 | Mccarthy |
| 3,515,619 | A | 6/1970 | Barnette |

(Continued)

FOREIGN PATENT DOCUMENTS

| | | |
|---|---|---|
| EP | 1748884 | 2/2007 |
| GB | 1381478 | 1/1975 |

(Continued)

OTHER PUBLICATIONS

JP 2006/27332 A, Machine Translation.*

(Continued)

*Primary Examiner* — Prashant J Khatri
*Assistant Examiner* — Travis Figg
(74) *Attorney, Agent, or Firm* — Schwabe, Williamson & Wyatt

(57) ABSTRACT

A decorative fabricated covering includes a first piece of vinyl. A first ink layer is printed on the first piece of vinyl and a textured layer is printed on top of the first ink layer. A second ink layer is printed on a second separate piece of vinyl. The first and second pieces of vinyl are then laminated together. An overprint layer may be printed on top of the textured layer and a second textured layer may be printed on top of the overprint resin layer. A domed layer may be formed on top of the second ink layer and a reflective material, such as glitter, may be mixed in the second textured layer.

20 Claims, 12 Drawing Sheets

(51) Int. Cl.

| | |
|---|---|
| ***B44C 3/02*** | (2006.01) |
| ***B44F 1/04*** | (2006.01) |
| ***B44F 9/04*** | (2006.01) |
| *E04F 15/08* | (2006.01) |

(56) References Cited

U.S. PATENT DOCUMENTS

| | | | | |
|---|---|---|---|---|
| 3,533,889 | A | 10/1970 | Powell | |
| 3,562,941 | A | 2/1971 | Boden | |
| 3,815,263 | A | 6/1974 | Oberwager | |
| 3,915,087 | A | 10/1975 | Tiemann | |
| 3,931,425 | A | 1/1976 | Kuroda | |
| 4,070,259 | A | 1/1978 | De Poortere et al. | |
| 4,070,781 | A | 1/1978 | Sauer | |
| 4,078,492 | A | 3/1978 | Levy et al. | |
| 4,127,689 | A | 11/1978 | Holt | |
| 4,225,369 | A | 9/1980 | Felchlin | |
| 4,231,634 | A | 11/1980 | Gantz et al. | |
| 4,283,451 | A | 8/1981 | Abrahami | |
| 4,302,260 | A | 11/1981 | Meltzer | |
| 4,312,688 | A | 1/1982 | Brodis et al. | |
| 4,320,174 | A | 3/1982 | Rabinovitch et al. | |
| 4,407,525 | A | 10/1983 | Hoppe | |
| 4,457,961 | A | 7/1984 | Nakazawa et al. | |
| 4,528,232 | A | 7/1985 | Cliffe | |
| 4,684,675 | A | 8/1987 | Collier | |
| 4,749,222 | A | 6/1988 | Idland | |
| 4,791,745 | A | 12/1988 | Pohn | |
| 4,863,782 | A | 9/1989 | Wang et al. | |
| 4,960,671 | A | 10/1990 | Dickinson | |
| 5,021,278 | A | 6/1991 | Short | |
| 5,144,328 | A | 9/1992 | Blake et al. | |
| 5,202,180 | A * | 4/1993 | Watts | 428/324 |
| 5,217,791 | A | 6/1993 | Fujita et al. | |
| 5,258,214 | A | 11/1993 | Cooledge et al. | |
| 5,273,796 | A | 12/1993 | Elbing et al. | |
| 5,289,351 | A | 2/1994 | Kashima et al. | |
| 5,577,947 | A | 11/1996 | Malloy et al. | |
| 5,594,191 | A | 1/1997 | Epstein et al. | |
| 5,617,790 | A | 4/1997 | Chmielnik | |
| 5,672,413 | A | 9/1997 | Taylor et al. | |
| 5,707,684 | A | 1/1998 | Hayes et al. | |
| 5,735,590 | A | 4/1998 | Kashima et al. | |
| 5,829,789 | A | 11/1998 | Treleaven et al. | |
| 5,858,139 | A | 1/1999 | Ouderkirk | |
| 5,871,571 | A | 2/1999 | Rendall et al. | |
| 5,887,393 | A | 3/1999 | Vanark et al. | |
| 5,916,450 | A | 6/1999 | Muggli et al. | |
| 5,925,453 | A | 7/1999 | Kase | |
| 5,940,215 | A | 8/1999 | Rudisill et al. | |
| 5,959,067 | A | 9/1999 | Bakker et al. | |
| 5,972,453 | A | 10/1999 | Akiwa et al. | |
| 6,030,002 | A | 2/2000 | Charley et al. | |
| 6,054,208 | A | 4/2000 | Rega et al. | |
| 6,060,157 | A * | 5/2000 | LaPerre et al. | 428/325 |
| 6,136,127 | A | 10/2000 | De Bastiani | |
| 6,231,183 | B1 | 5/2001 | Dillon | |
| 6,280,063 | B1 | 8/2001 | Fong et al. | |
| 6,358,598 | B1 | 3/2002 | Hicks | |
| 6,633,666 | B2 | 10/2003 | Gill et al. | |
| 6,721,102 | B2 | 4/2004 | Bourdelais et al. | |
| 6,900,941 | B2 | 5/2005 | Kaminsky et al. | |
| 6,997,566 | B2 | 2/2006 | Hannington | |
| 7,048,307 | B1 * | 5/2006 | Scarbrough | B42D 15/02<br>283/107 |
| 7,468,203 | B2 | 12/2008 | Hicks | |
| 7,615,276 | B1 * | 11/2009 | Goodson | 428/195.1 |
| 2002/0039632 | A1 | 4/2002 | Hicks | |
| 2003/0108724 | A1 | 6/2003 | Hicks | |
| 2003/0205895 | A1 * | 11/2003 | Scarbrough | B41M 3/148<br>283/91 |
| 2004/0213974 | A1 | 10/2004 | Hicks et al. | |
| 2005/0255292 | A1 | 11/2005 | Hicks et al. | |
| 2006/0019074 | A1 * | 1/2006 | Scarbrough | B41M 1/18<br>428/195.1 |
| 2006/0270298 | A1 * | 11/2006 | Kuhn et al. | 442/260 |
| 2007/0275167 | A1 | 11/2007 | Hicks | |
| 2009/0068408 | A1 * | 3/2009 | Hicks et al. | 428/156 |
| 2010/0018644 | A1 * | 1/2010 | Sacks | B32B 7/02<br>156/277 |

FOREIGN PATENT DOCUMENTS

| | | | |
|---|---|---|---|
| GB | 2324381 | A | 10/1998 |
| JP | 11048395 | A | 2/1999 |
| JP | 2006273332 | A * | 10/2006 |
| WO | WO/03/023505 | | 3/2003 |
| WO | WO/03/055692 | | 7/2003 |
| WO | WO/2005/113234 | | 1/2005 |
| WO | WO 2005027696 | A1 * | 3/2005 |
| WO | WO/2008/086436 | | 7/2008 |

OTHER PUBLICATIONS

Sixteen (16) sheets of digital photographs showing Artscape's Versailles decorative window film. At least as early as 2002.

"Borders for Kids" advertisement, 1996.

"Development Timeline," Tom Hick, 1996-1999.

"Etch Art, Inc." advertisement, date unknown.

"Self-clinging vinyl blocks harmful UV rays," undated advertisment for Solar Stat self-adhering vinyl film product (Silvohome Product).

Advertisement for Solar Stat, date unknown.

SFC Listing of Related Cases for 1505-0032.

SFC Listing of Related Cases for 1505-0101.

International Preliminary Report on Patentablility and Written Opinion for PCT/US08/050658; Date of mailing Apr. 9, 2008.

International Search Report for PCT/US/08/050658; Date of mailing Apr. 9, 2009.

International Preliminary Report on Patentablility and Written Opinion for PCT/US05/016351; Date of mailing Jun. 29, 2006.

International Search Report for PCT/US05/016351; Date of mailing Jun. 29, 2006.

European Patent Office; Supplemental Search Report EP 05749806.5; Dated May 10, 2010; 4 pgs.

* cited by examiner

DECORATIVE COVERINGS

BACKGROUND OF THE INVENTION

Stone, ceramic tiles, and fused glass are used for covering floors, walls, back splashes, and for any other type of decorative application. Tiles take significant resources to manufacture and are relatively expensive. For example, stone tiles are fabricated from pieces of mined rock. Ceramic tiles are formed from pieces of clay, fired in a kiln, glazed, and then re-fired in the kiln.

Other less expensive decorative coverings exist. For example, decals and stickers with adhesive backings can be attached to walls, windows, mirrors, etc. The decals typically comprise a thin layer of plastic or paper but do not have the dimensional textured 3-dimension characteristics of stone, ceramic, fused glass, or any other natural organic material. Thus, decals and stickers may have a lower aesthetic appeal and provide a lower impression of quality than stone or ceramic tiles.

DESCRIPTION OF THE PREFERRED EMBODIMENTS

A fabricated decorative covering is dimensional and thus replicates some of the aesthetics provided by organic materials, such as stone, fused glass, ceramic, or any other three dimensional object. An ink layer forms an image on a vinyl sheet. One or more textured layers are applied to the sheet and create a three-dimensional (3-D) light effect that refracts light at different random angles. Another ink layer may be applied to a second vinyl sheet forming a second image. The two vinyl sheets may be laminated together to further accentuate the 3-D characteristics between the two images. The one or more vinyl sheets may provide high quality aesthetics and may be less expensive to manufacture, than organic and other 3-D materials.

Instead of grout and mortar, the fabricated coverings may include an adhesive for attaching to surfaces. The coverings may be installed more quickly and may require less skill for properly attaching to different surfaces.

Figure 1:
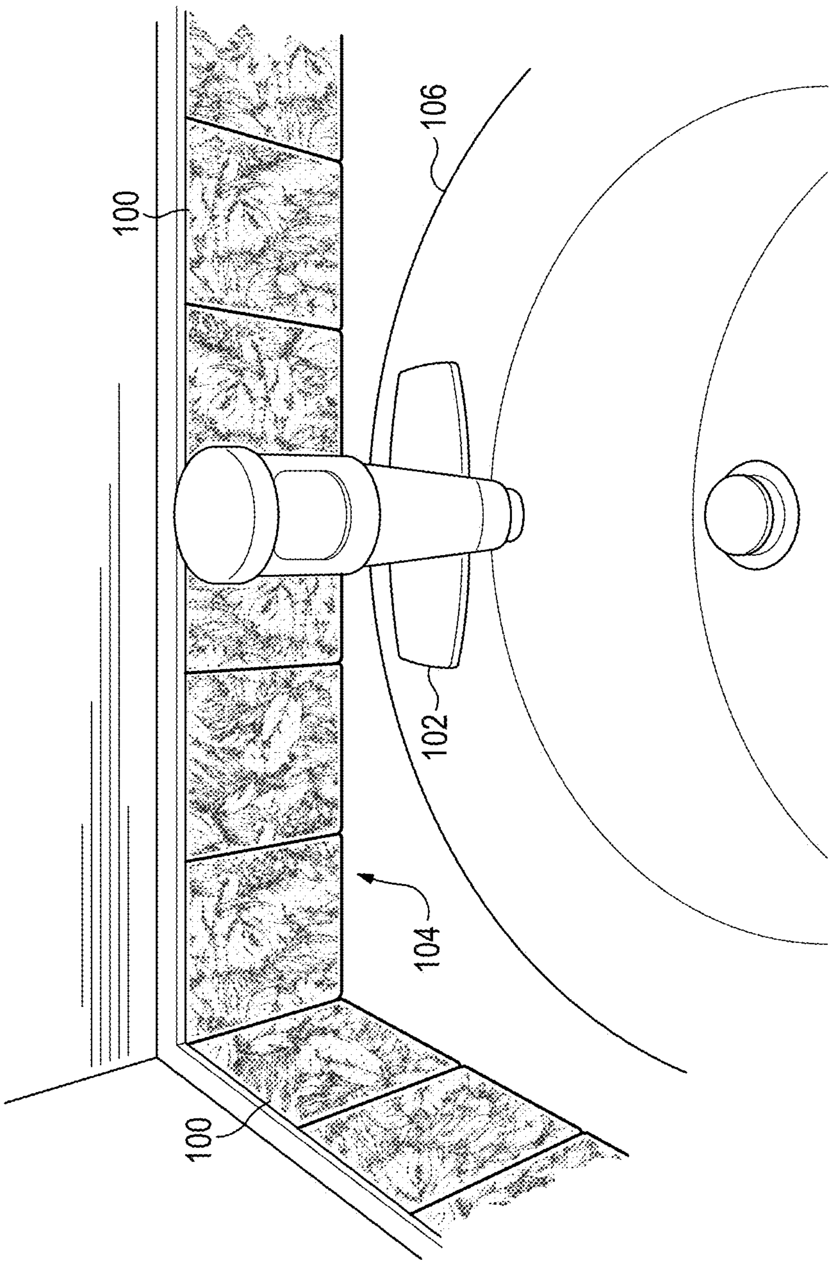
FIG. 1 is a perspective view of a fabricated tile applied to a backsplash.

FIG. 1 shows an array of coverings 100 attached to a backsplash 104 of a sink 106. Coverings 100 are referred to below as tiles 100. However, it should be understood that coverings 100 may be formed into any shape and/or dimension. In one example, tiles 100 are made from vinyl and are formed into substantially square shapes or rectangular shapes.

Figure 2:
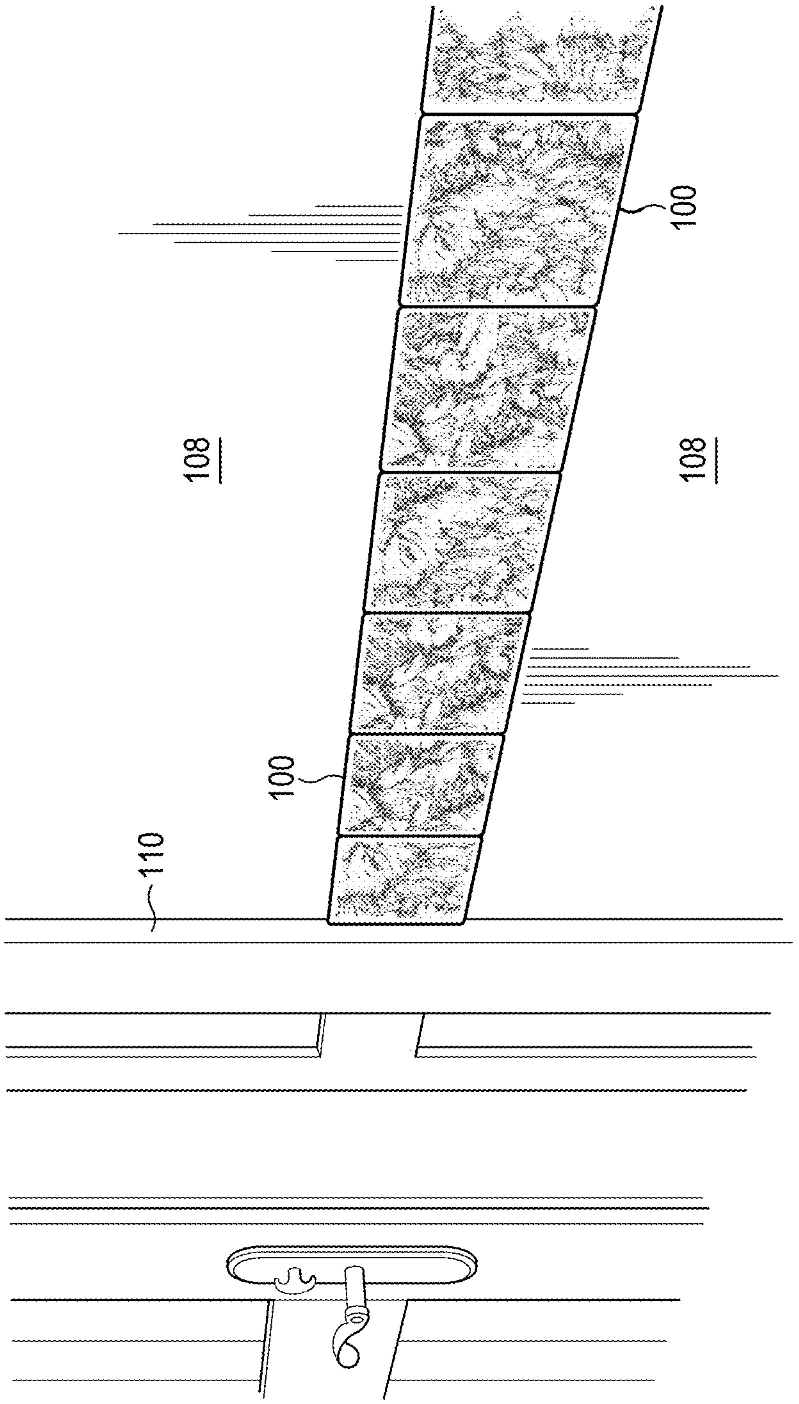
FIG. 2 is a perspective view of a fabricated tile applied to a wall.

In the example of FIG. 1, tiles 100 are attached with an adhesive to backsplash 104 in back of a faucet 102 and on the sides of a sink 106. In a second example in FIG. 2, tiles 100 are attached to a wall 108 next to a door 110. Tiles 100 may be attached to any surface and may be formed into any variety of different shapes and/or patterns. Tiles 100 may cover aesthetically unpleasing objects, such as holes or trim extending around a minor. Tiles 100 also may improve or change the look of a room without hiding any aesthetically unpleasing objects.

In one example, an adhesive is pre-applied at a factory to a bottom surface of tiles 100. A user may remove a paper cover from a back side of tile 100 and simply press the tile against a surface. After a few hours the adhesive bonds tile 100 to the surface.

A repositionable permanent adhesive may be used that allows tile 100 to be attached to a surface and then observed. If the installer does not like the original tile position, tile 100 can be removed and repositioned. After an acceptable position is obtained, the installer then applies additional pressure to the tile and leaves the tile in place on the surface for several hours. After several hours, the adhesive permanently bonds tile 100 to the surface.

In one example, the adhesive may be formed from an opaque material and hide the attached surface. For example, in FIG. 2 the opaque adhesive may cover and hide portions of wall 108 behind tiles 100. In another example, a substantially transparent adhesive may be applied to the back side of tiles 100. In this example, the tile 100 may be at least partially transparent and/or translucent and may allow light to at least partially pass through tile 100. For example, tile 100 may be attached to a window or a mirror. The transparent adhesive and translucent tile 100 may allow a user to at least partially see through the tile and either see the attached minor or see through the attached window.

Figure 3:
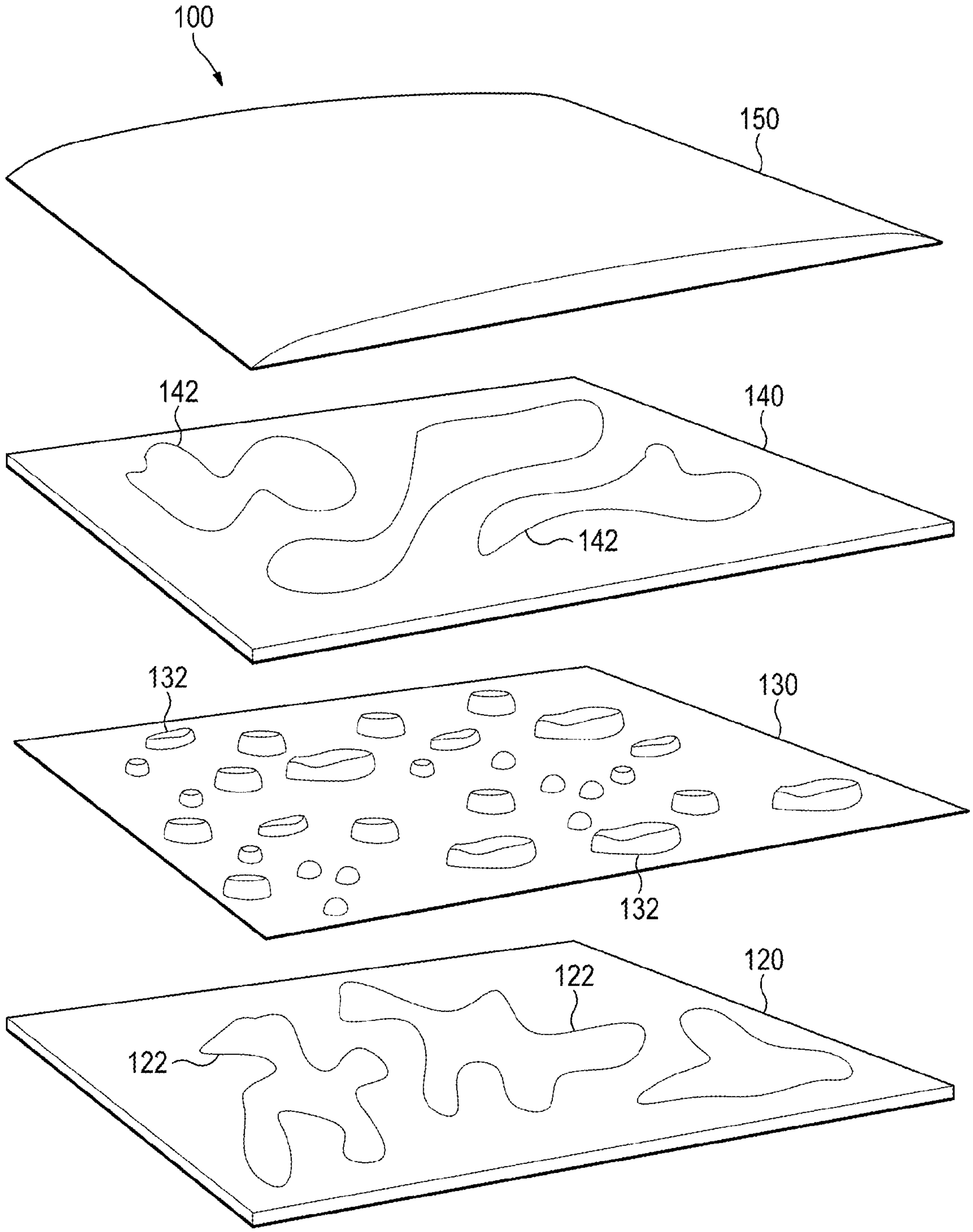
FIG. 3 is a perspective view showing different layers of a fabricated tile.

FIG. 3 shows an example of a two sheet laminated tile 100. A bottom sheet 120 and a top sheet 140 may each comprise a vinyl material. For example, bottom sheet 120 may comprise a 3.0 mil flexible gloss white vinyl manufactured on individual calendared sheets. One example vinyl sheet 120 is part number VFGW-TC-P/90# manufactured by Interluxy Gmbh, Judenpfad 72, 50996 Cologne Germany. Bottom sheet 120 may include a transparent or opaque adhesive on the bottom surface.

In one example, top sheet 140 may comprise a 3.0 mil high gloss UV overlaminating film manufactured on a vinyl roll. One example vinyl sheet 140 is part number 400-30 also manufactured by Interluxy Gmbh, Judenpfad 72, 50996 Cologne Germany. Top sheet 140 may include a transparent adhesive on a bottom surface.

Any type of film, plastic, vinyl, resin, or the like, with any type of thickness and/or manufactured form or size may be used for sheets 120 and 140. In one example, sheets 120 and 140 each include a bottom adhesive layer. In one example, the bottom of sheet 120 has a substantially opaque adhesive layer and the bottom of sheet 140 has a substantially transparent adhesive layer. As described above, an opaque adhesive layer on the bottom of sheet 120 may cover/hide whatever is attached behind tile 100. The transparent adhesive layer on the bottom of sheet 140 allows light to pass through sheet 140 and reflect and refract within bottom sheet 120 enabling viewing of images printed on sheet 120.

In one example, a first image 122 is printed onto sheet 120 and a second image 142 is printed onto sheet 140. In one example, images 122 and 142 may simulate different veins of materials running through a piece of stone, such as marble or granite. Of course, images 122 and 142 may comprise any combination of different shapes and colors. In one example, image 122 may be applied using a lithograph inking process and image 142 may be applied using an inkjet printing process. But again any type of printing or inking process may be used on sheets 120 and 140 for forming images 122 and 142, respectively.

One or more textured layers 130 are applied on sheet 120. Textured layer 130 may comprise a pattern of random or semi-random shaped bumps or protuberances 132. The bumps 132 may be arranged into different patterns on sheet 120. In one example, a screen printing process may be used for applying textured layer 130 and forming bumps 132. One example screen printing process for forming and applying textured layer 130 is described in U.S. Pat. No. 7,468,203, issued Dec. 23, 2008, entitled: Textured Window Film, which is herein incorporated by reference in its entirety. In another example, a flexographic printing process may be used for one or more of the ink or textured layers.

Figure 4:
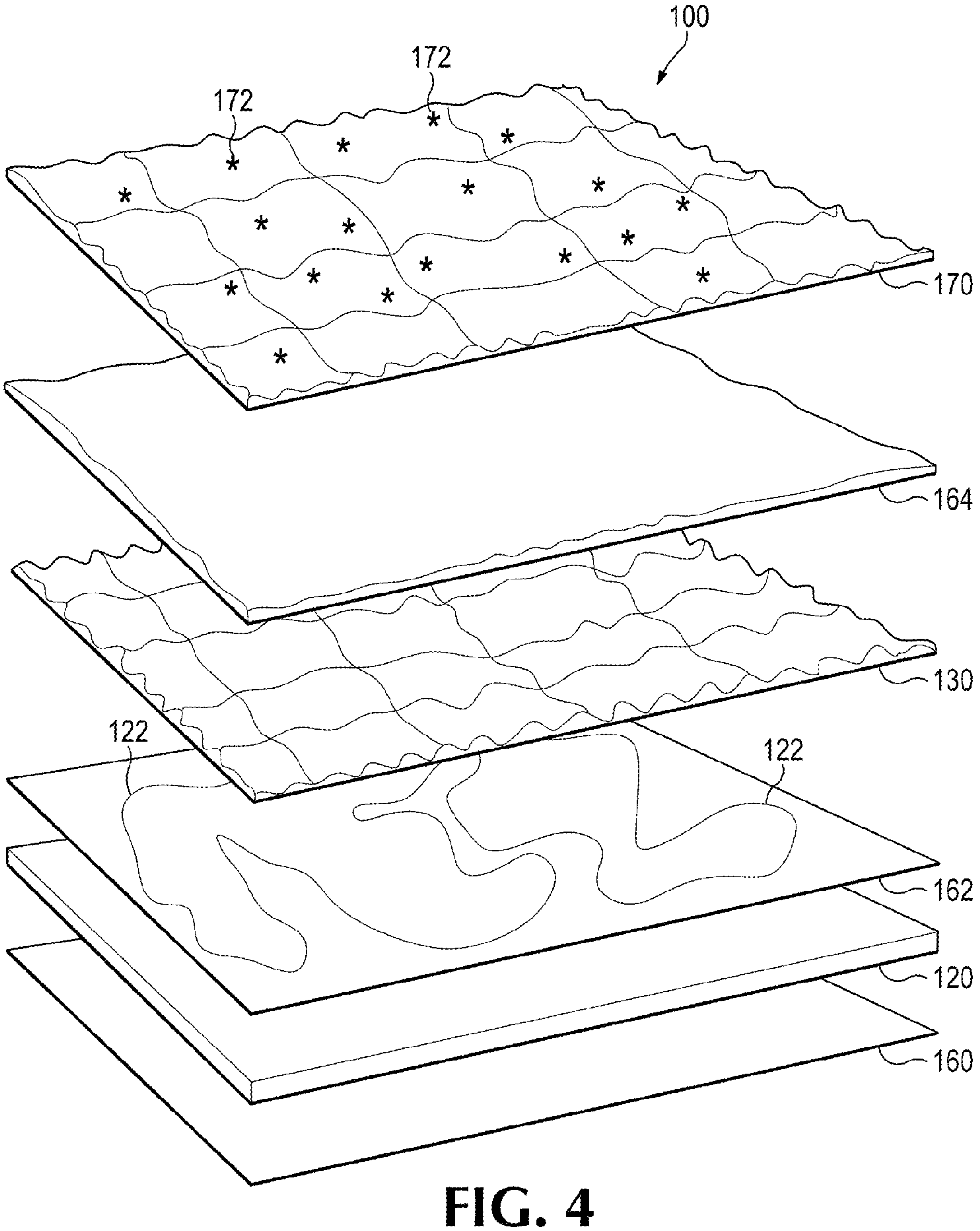
FIG. 4 is a perspective view showing in more detail different layers applied to a bottom sheet of the fabricated tile.

A transparent overprint clear layer may be applied over textured layer 130 (see FIG. 4). For example, a second stage of the screen printing process may apply a transparent resin over textured layer 130. The overprint layer partially fills some of the spaces between bumps 132 and provides a more finished aesthetic impression when tile 100 is completed. The overprint layer is shown in more detail in FIGS. 4 and 5. A second textured layer may be applied over the overprint layer and is also shown in more detail in FIGS. 4 and 5.

Image 142 is printed on top of sheet 140 and sheet 140 is laminated with sheet 120. For example, a roller may press the bottom of sheet 140 against the top of sheet 120 and the transparent adhesive on the bottom of sheet 140 laminates sheets 120 and 140 together. The laminated sheets 120 and 140 are then die-cut into different shapes, such as into the shape of tile 100. In one example, one or more drops of transparent liquid resin are poured onto the top of sheet 140. Gravity combined with a capillary action creates a smooth domed shaped layer 150 on the top surface of sheet 140.

In one example, tile 100 contains two or more images on two different laminated sheets thus providing a physical spacing and associated 3-D effect between image 142 on sheet 140 and image 122 on sheet 120. Textured layer 130 increases the 3-D effect between images 122 and 142 by refracting light at different angles and thus simulating non-uniform textures that may exist in some 3-D objects, such as in stones and other organic materials.

FIG. 4 shows in more detail one example of different layers that may be applied to bottom sheet 120. As mentioned above, an opaque adhesive layer 160 may be applied to a bottom side of sheet 120 and hide a portion of the structure attached to tile 100.

As also mentioned above, adhesive layer 160 may alternatively be transparent for use in other applications where the structure behind tile 100 does not need to be covered. For example, a transparent adhesive layer 160 may be used when tiles 100 are applied to windows so light may pass through the window and tile 100. Transparent adhesive layer 160 also may be used when tiles 100 are applied to mirrors and prevent a dark tile image from being reflected back out from the minor.

An ink layer 162 is applied on the top surface of sheet 120. As mentioned above, a lithograph printing process may be used for applying ink layer 162 and forming image 122. Any combination of colors may be used in ink layer 162 and may form any combination of images 122. Some of the colors may be more opaque and other colors may be more transparent or translucent.

Textured layer 130 is printed on top of ink layer 162. Textured layer 130 may comprise any transparent or translucent material that creates a non-even surface on sheet 120. As explained above, in one example textured layer 130 is formed by applying a transparent resin on sheet 120 through an emulsion screen. Opacitors may be used in the resin to reduce transparency. The emulsion screen includes a pattern that forms different protuberances or bumps that have different shapes and sizes. The bumps also may be formed into different patterns within different areas of sheet 120.

An overprint layer 164 may be formed on top of textured layer 130. Overprint layer 164 also may comprise resin, clear varnish, clear coat, or the like. In one example, the resin in overprint layer 164 may be less viscous than the resin used for forming textured layer 130.

The combination of image 122, textured layer 130, and overprint layer 164 promote prismatic characteristics on light that produce a 3-D effect. For example, the bumps formed in textured layer 130 may refract or bend incoming light while substantially flat areas within textured layer 130 may create little or no refraction of incoming light.

Optionally a second textured layer 170 may be formed on top of overprint layer 164. Two layers of bumps create more of a random bump characteristic. Textured layer 170 also may comprise a substantially transparent or translucent resin that provides another non-even surface on sheet 120. Textured layer 170 may be formed in a manner similar to textured layer 130 by applying a transparent resin through an emulsion screen. The emulsion screen used for textured layer 170 may form a pattern of bumps and the bumps also may have different shapes and sizes compared with the bumps in textured layer 130.

In one example, objects 172 may be mixed with the resin used for forming textured layer 170. In one example, at least some of objects 172 comprise a reflective glitter material that may provide additional visual contrast and depth variance relative to image 122. In one example, objects 172 may comprise a Micronic Jewles glitter having sizes of 0.004×0.004 inches (100 microns) manufactured by Meadowbrook Inventions, Inc., PO Box 960 Mine Brook Road, Bernardsville, N.J. 07924. However, any size, shape, and/or type of material may be used in objects 172. In another example, objects 172 alternatively, or in addition, may be mixed within textured layer 130.

As discussed above, sheet 120 with layers 160, 162, 130, 164, and 170 is laminated with sheet 140 in FIG. 3. The two laminated sheets are then die cut into multiple tiles 100 and drops of resin applied to the top surface of the tiles 100 to form domed layers 150 in FIG. 1.

Tiles 100 can provide a substantially limitless variety of different visual effects. For example, different textured patterns and images can be created that simulate visual effects that exist in stone, fused and/or textured glass, ceramics, wood, metal, or any other material.

Figure 5:
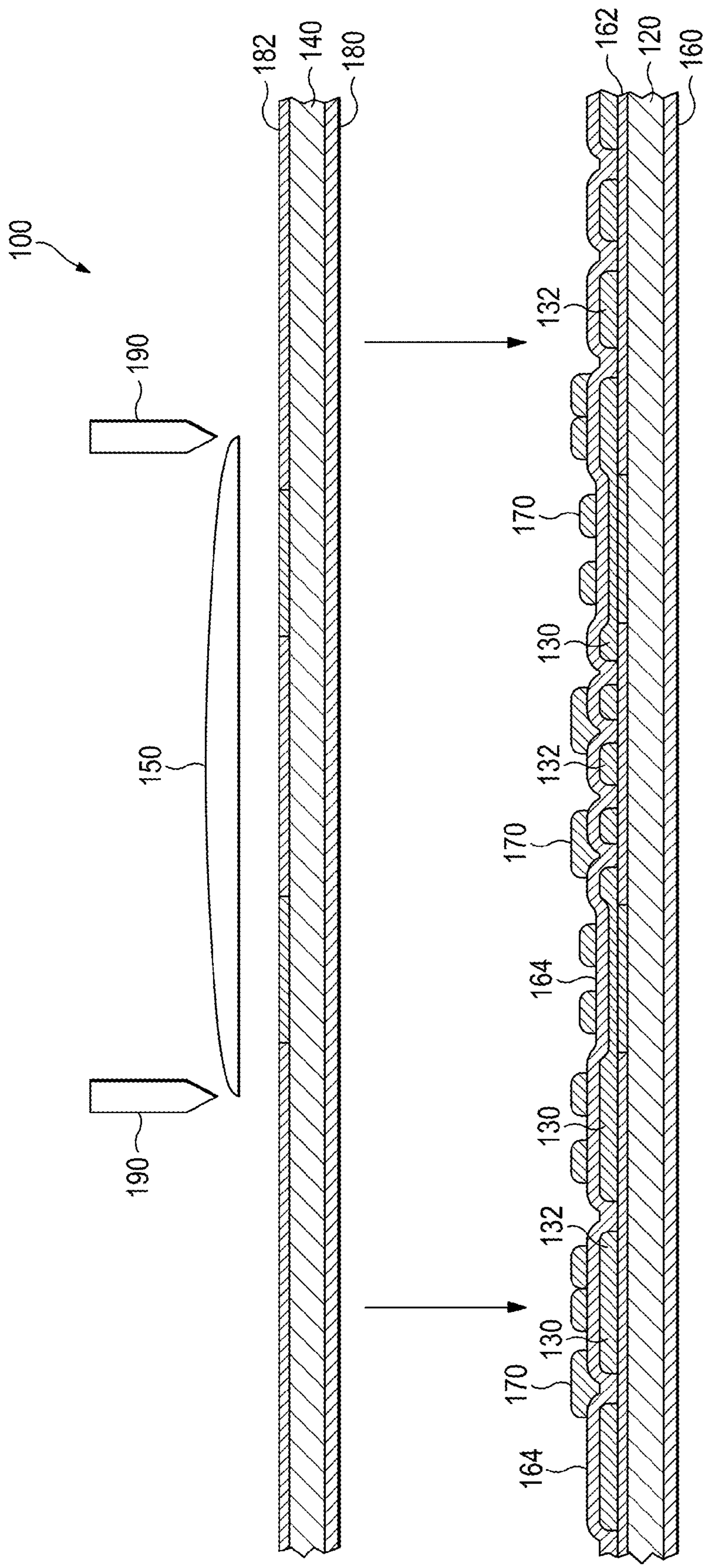
FIG. 5 is a cross-sectional view of a fabricated tile.

FIG. 5 shows a cross-sectional view of tile 100. Adhesive layer 160 is applied to the bottom side of sheet 120 and ink layer 162 is applied to the top side of sheet 120. Textured layer 130 is applied on top of ink layer 162 and forms an uneven surface on top of sheet 120.

Overprint layer 164 is printed on top of textured layer 130 and in one example fills in some of the spaces between bumps 132. Bumps 132 may create a rough undefined look. Overprint layer 164 creates a smooth clearer sealed layer over bumps 132 and provides a more visually refined aesthetic property to tile 100. Textured layer 170 is formed on top of overprint layer 164. In one example, textured layer 170 comprises a second set of bumps with a second set of shapes formed into a second pattern. Textured layer 170 creates additional 3-D effects in tile 100.

Adhesive layer 180 is applied to a bottom side of sheet 140 and an ink layer 182 forming image 142 (FIG. 3) is applied to a top side of sheet 140. Adhesive layer 180 on the bottom side of sheet 140 is pressed against the top side of sheet 120 laminating sheets 120 and 140 together.

Adhesive layer 180 also may fill in some of the spaces between bumps in textured layer 170 so the bumps may be less visible while still providing physical separation. Sheet 140 seals the second textured layer 170 and provides additional physical distance and dimension between ink layer 162 and ink layer 182. Sheet 140 also provides a relatively smooth top layer for receiving dome layer 150.

Spacing provided by sheets 120 and 140 increases light refraction between image 122 on ink layer 162 and image 142 on ink layer 182, respectively (FIG. 1). The 3-D light effects could be neutralized if a smooth resin layer were alternatively used for sealing textured layer 170. For example, the resin layer could fill-in the valleys formed in textured layer 170 neutralizing some of the 3-D characteristics provided by the textured surface.

After lamination, a weeding process is performed where stamp 190 cuts pieces of laminated sheets 120 and 140 into tiles 100. In one example, stamp 190 cuts laminated sheets 120 and 140 while a paper backing (not shown) remains attached to adhesive layer 160 on the bottom surface of sheet 120. Portions of laminated sheets 120 and 140 between stamped tiles 100 are removed from the top of the paper backing forming spaces between tiles 100.

Drops of resin are applied to the top surface of the spaced apart tiles 100. Vertical sides of each spaced apart tile 100 extend perpendicularly up from a top horizontal surface of the paper backing. As explained above the combination of gravity and capillary action causes the drops of resin to spread over the top surface of each individual tile 100 and form domed layer 150.

The heterogeneous compositions and perpendicular orientations between the paper backing and the sides of tiles 100 create a capillary effect where the drops of resin spread out until reaching the edges of each tile 100. The resin then stops spreading and dome around the tile perimeter edges. The stamping process performed by stamp 190 cuts individual tiles 100 without cutting into the paper backing. The continuous non-cut paper backing maintains the heterogeneous boundary between the paper backing and the sides of tiles 100 preventing the resin in dome layer 150 from flowing over the edges of stamped tiles 100.

Screen Printing Process

A screen is used for printing textured layers 130 and 170 on top of sheet 120. A pattern is formed in areas of the screen using a photosensitive emulsion that is applied as either a liquid coating or in sheet form. A pattern is applied over the emulsion and the emulsion is then exposed to light. The areas in the emulsion that were covered by the pattern remain soft and are washed out forming open areas. The areas not covered by the pattern remain blocked off with emulsion.

The screen is located over sheet 120 and a resin material is spread over the screen. Using a squeegee, the resin is spread through the unblocked areas in the screen and onto sheet 120 forming textured layer 130. In one example, the resin material is clear, but other degrees of opaqueness or color can be used.

The size and shape of the individual bumps 130 and areas within textured layer 130 can be relatively consistent or can vary in shape, size or spacing. If different areas of textured layer 130 have different shapes, the corresponding bumps 132 formed in the different areas also may have different shapes.

It should also be noted that the variable size and shape of bumps 132 formed in textured layer 130 and the bumps formed in textured layer 170 help promote the random or semi-random refraction of light creating the 3-D visual aesthetic in tile 100.

In one example, the same systematic pattern of bumps 132 is repeated for multiple sections of sheet 120. Bumps 132 can be created in any repeating, random, or semi-random arrangement that refracts light in different directions. The bump patterns can then be used to form visual subpatterns that simulate different surfaces or materials. This is shown in more detail below in FIG. 6.

In one example, the screens used for forming textured layer 130 and textured layer 170 have thread counts in the range of between 65-420 threads per inch and the thickness of the photosensitive emulsion used to coat the screens is anywhere between 1 mil-100 mils. But in other examples, the screens are coated with emulsion to a depth of about 6.0-8.5 mils. The range of 6.0-8.5 mils of emulsion produces a thickness for textured resin layer 130 of around 1.0-5.5 mils.

It should be understood that the dimensions and composition of tile 100, emulsion and resin can all vary and still provide the 3-D effect described above. The specific dimensions and materials used can be changed to created different lighting and application characteristics.

A second screening process is used for forming overprint layer 164. A second screen is used that does not have a pattern formed from emulsion. In one example, the second screen comprises a uniform mesh of between about 110-420 threads per inch and is large enough to cover sheet 120. A second resin, clear varnish or clear coat is spread over the second screen applying a second substantially even resin layer over textured layer 130.

The resin used in overprint layer 164 may be less viscous than the resin used to form textured layer 130 and may comprise a mixture of TRPGDA by weight in a range of about 20-25%, resin acrylate by weight in a range of about 50-56%, HDOCA by weight in a range of about 18-22%, and photoinitiators by weight in a range of about 3-5%. Of course other materials can also be used to form overprint layer 164. A third screen pattern is then used for forming the bumps in textured layer 170.

In one example, an offset lithography process is used for applying ink layer 162 on sheet 120 and an inkjet printing process as used to applying ink layer 182 on sheet 140. However, any other process can also be used for applying ink layers 162 and 182, such as a screen printing process similar to that used for applying layers 130, 164, and 170 on sheet 120.

Offset lithography is widely used to produce full color images in mass such as magazines, brochures, posters and books. In the offset lithography example, an image is transferred from a plate wrapped around a cylinder onto sheet 120. The offset lithography process can be used to apply any image, pattern, uniform or non-uniform color, picture, etc. onto sheet 120.

The lithography process breaks down an image into small dots separated into four colors; yellow, magenta, cyan and black known as a four color process. The dots are reproduced onto the printing plate mentioned above. Each color has all the tones necessary to produce a photo quality image in ink layer 162. In one example, the ink used to form ink layer 162 and 182 is made of an elastic material that has similar elastic characteristics as sheet 120 and the resin in layers 130, 164, and 170.

Figure 6:
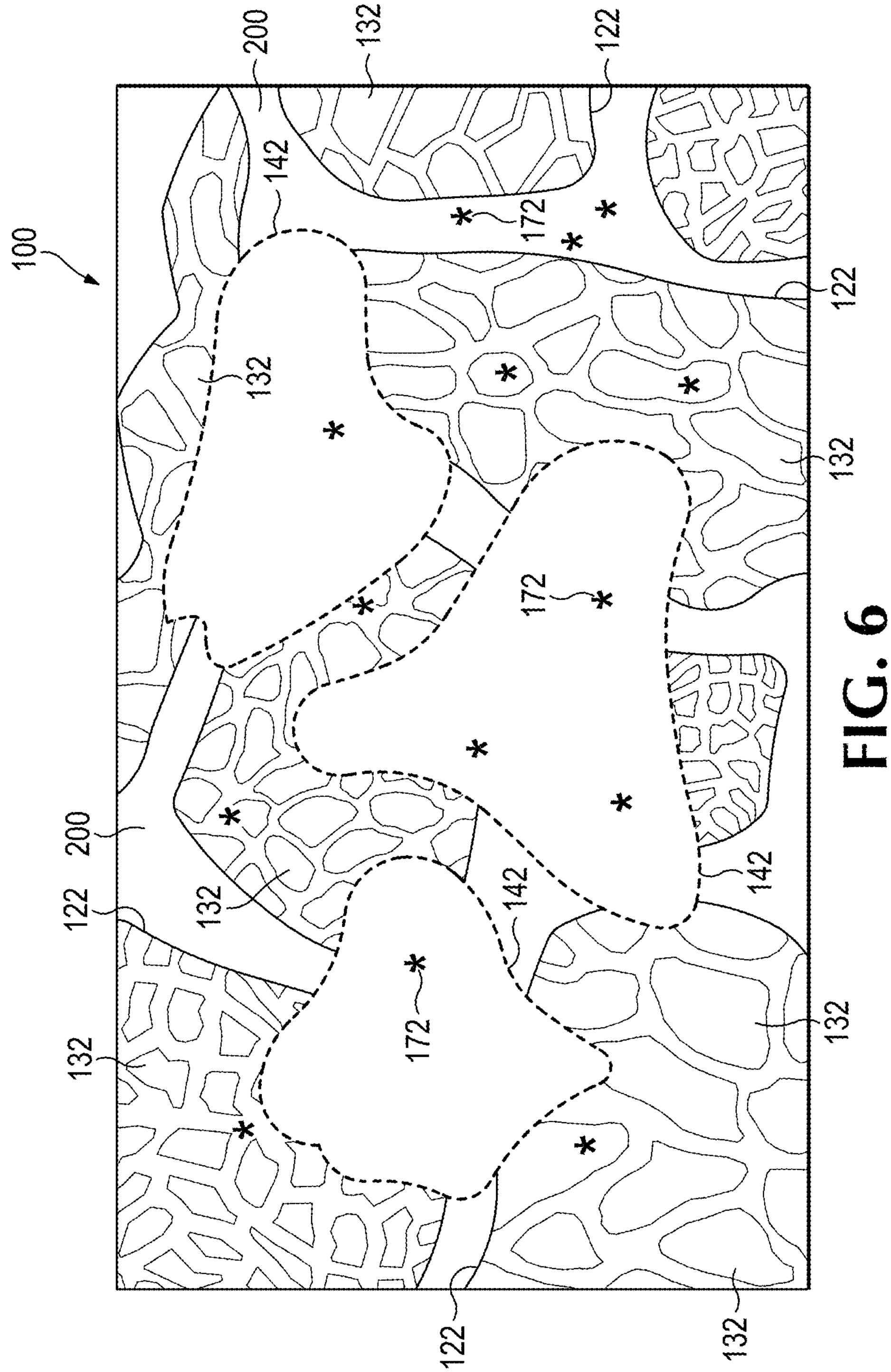
FIG. 6 is an example top plan view of a fabricated tile.

FIG. 6 shows a top plan view for one of tiles 100. In one example, bumps 132 in textured layer 130 may have different individual shapes and also may be formed into different patterns. Image 122 formed in ink layer 162 also have any combination of different colors and shapes. In one example, bumps 132 and/or images 122 replicate veins 200 and different materials within a stone.

As mentioned above, reflective objects 172, such as glitter, may be mixed into the second textured layer 170. Reflective objects 172 appear at different depths within textured layer 170 and reflect light at different angles accentuating the three dimensional and textured characteristics within tile 100. Objects 172 also may be mixed within other layers of tile 100. Image 142 formed on the top surface of sheet 140 (FIGS. 3-5) is shown in dashed lines.

Image 142 is physically separated from image 122 formed on sheet 120, bumps 132 formed on textured layer 130, and objects 172 formed in second textured layer 170. Thus, image 142 provides additional 3-D aesthetics within tile 100. In the stone example, image 142 may simulate additional veins of different materials within a rock or stone.

In another example, tile 100 may not be a laminate and may only comprise bottom sheet 120. In this example, dome layer 150 may be applied directly onto a single textured layer 130, applied onto overprint layer 164, or applied onto second textured layer 170.

Figure 7:
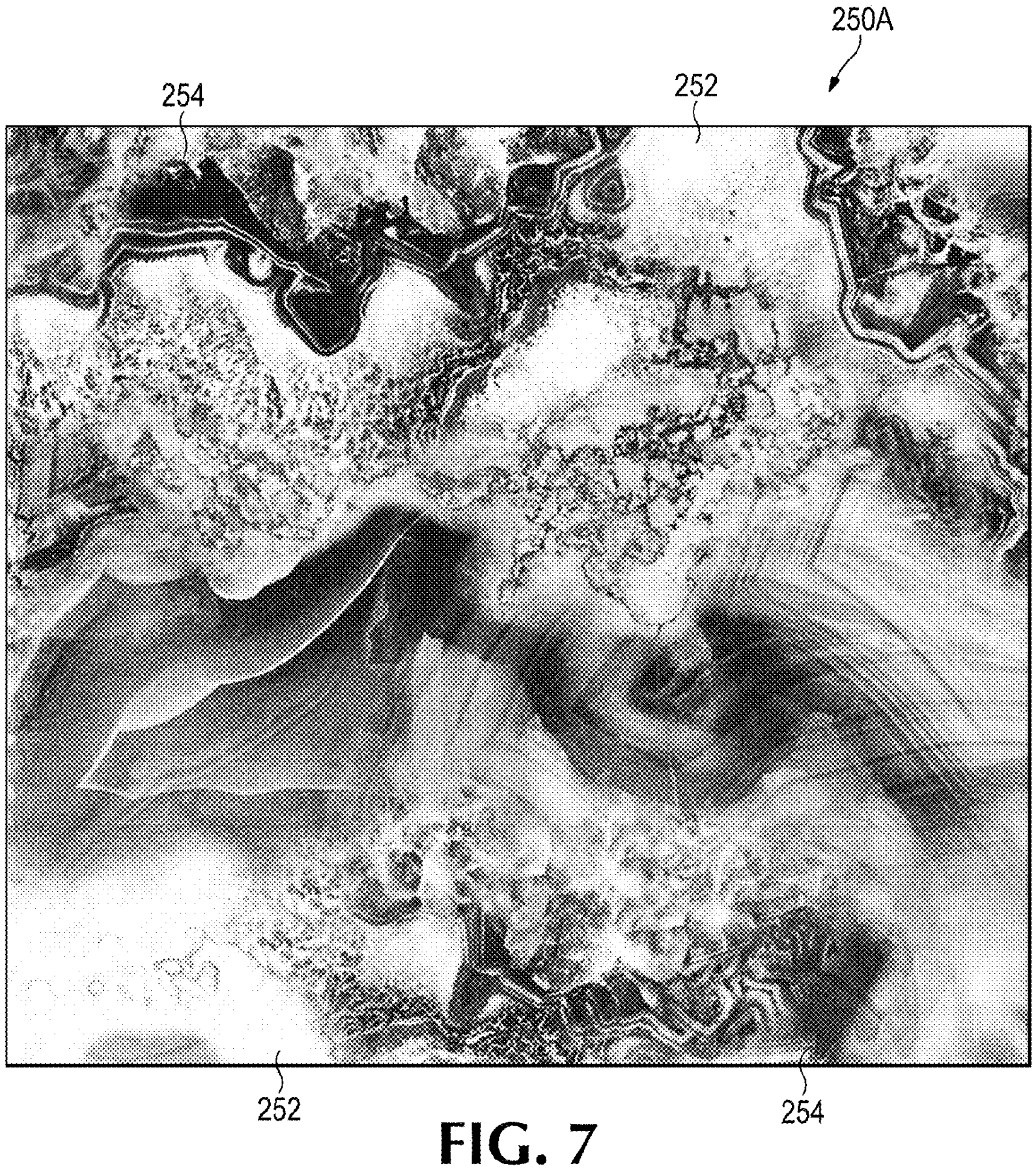
FIGS. 7 and 8 depict examples of images printed onto different layers of a fabricated tile.
Figure 8:
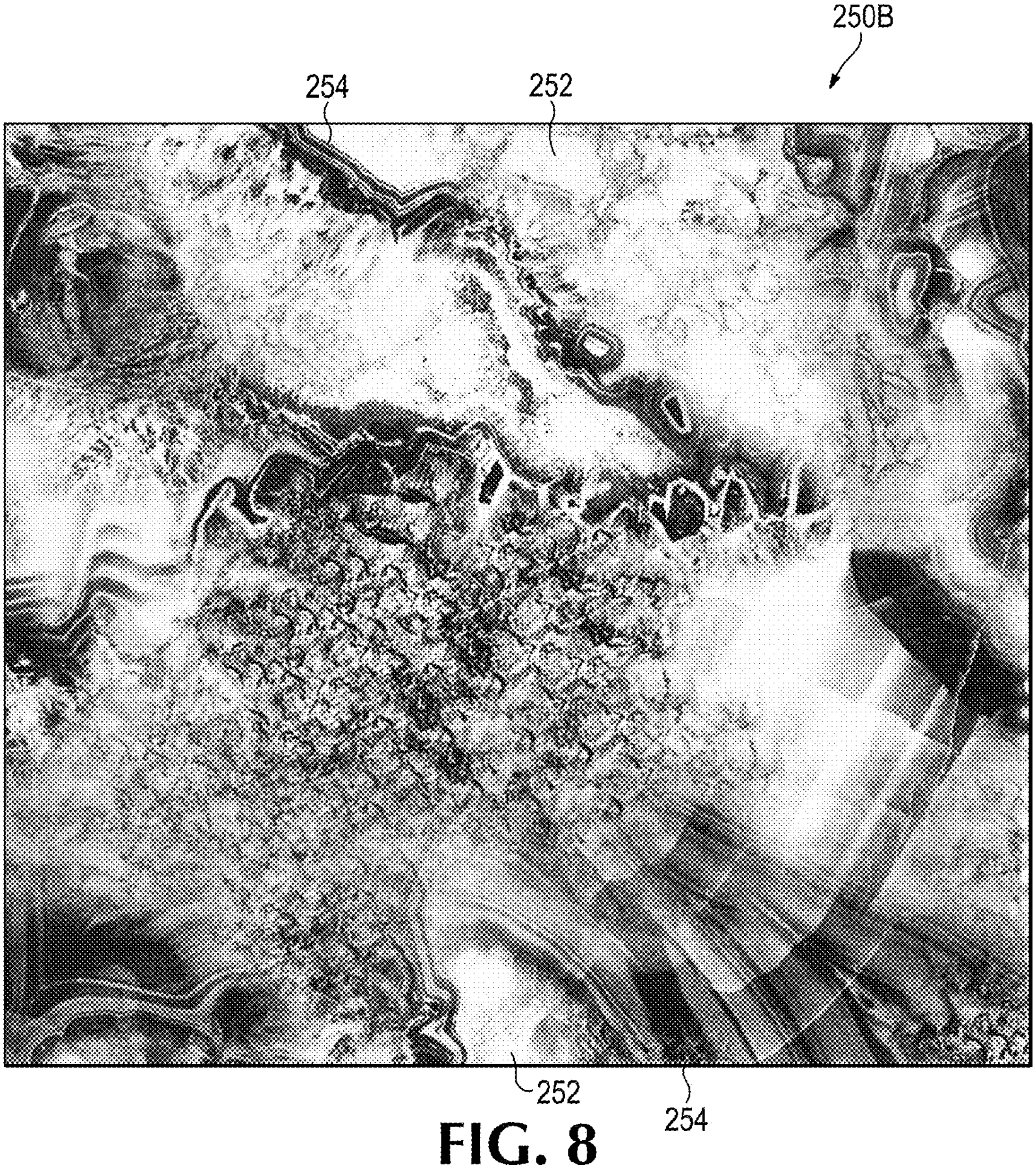
Figure 9:
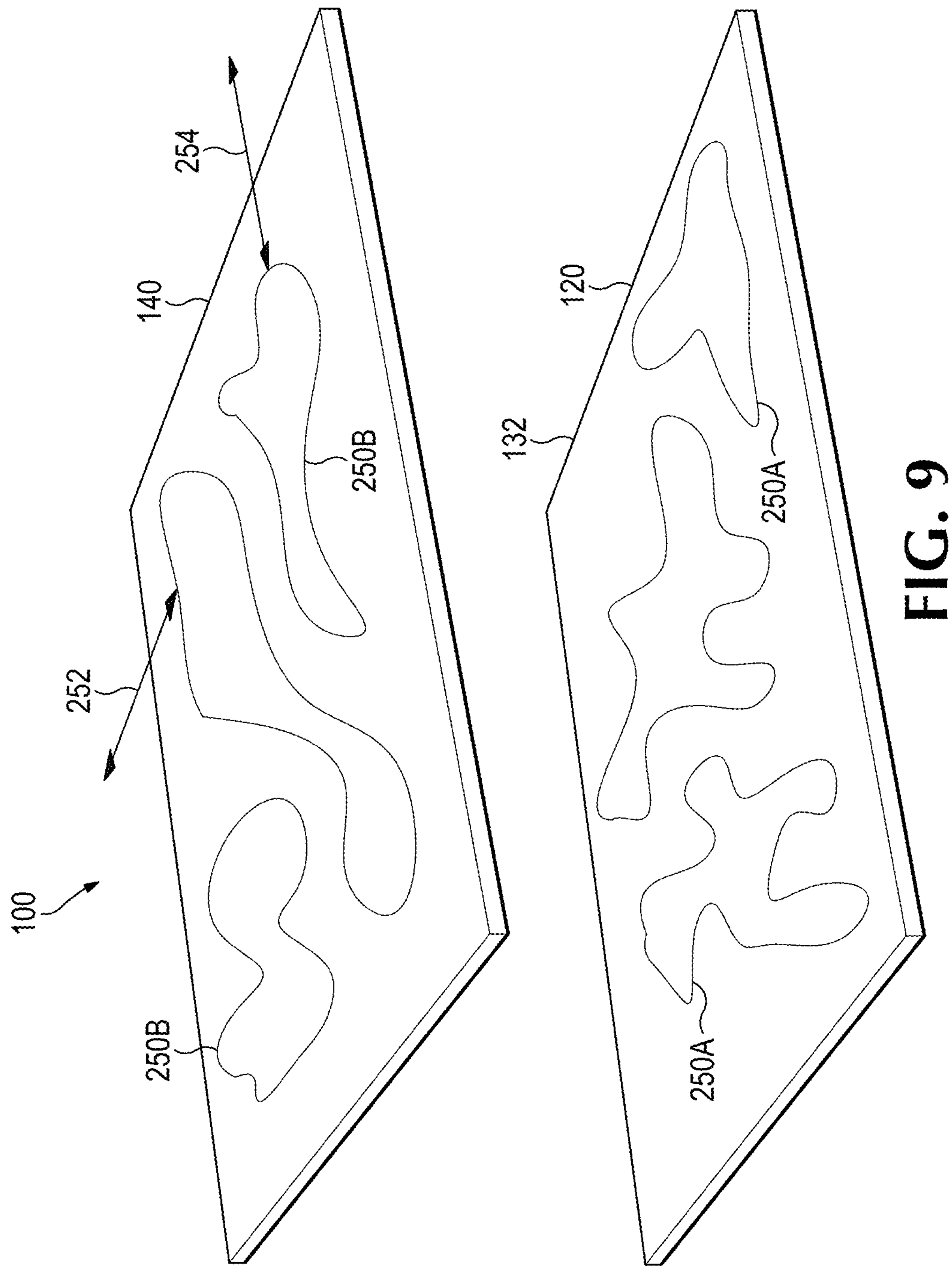
FIG. 9 depicts one example of how different images may be created within a fabricated tile from a same image pattern.

FIGS. 7, 8, and 9 depict other examples of images formed in different ink layers. For example, image 250A in FIG. 7 may be printed onto sheet 120 and image 250B in FIG. 8 may be printed onto sheet 140. Of course either image may be printed onto either sheet 120 or 140. As stated above, images 250A and 250B may be anything, but in one example may look like different organic materials that exist within rocks.

Different areas of images 250A and 250B may have different levels of opacity. For example, lighter or non-inked areas 252 may be transparent or translucent. Other darker inked areas 254 may be less translucent and/or more opaque. The different levels of opacity further increase the 3-D effects in tile 100 by further simulating different types of materials extending though different depths of a stone.

Referring specifically to FIG. 9, images 250A and 250B may be printed at different relative offsets 252 and 254 on sheets 120 and 140 to create different combined patterns. For example, in a first printing, images 250A and 250B may be printed onto sheets 120 and 140 as shown in FIG. 9. The positional relationship between images 250A and 250B create a first combined image.

In a second printing, the same image 250B may be printed onto sheet 140 but with an offset 252 with respect to image 250A printed onto sheet 120. Offset 252 of image 250B with respect to image 250A creates a completely new combined image within tile 100. In a third printing, the same image 250B may be printed onto sheet 140 but with an offset 254 with respect to image 250A printed onto sheet 120. Offset 254 of image 250B with respect to image 250A creates a third completely new combined image within tile 100.

Thus, even slight changes in the amount and direction of offsets 252 and 254 of image 250B with respect to image 250A may create an almost infinite number of unique combined images within each tile 100. These unique combined images in tiles 100 further enhance aesthetic appeal and simulate the unique visual characteristics of organic materials.

Figure 10:
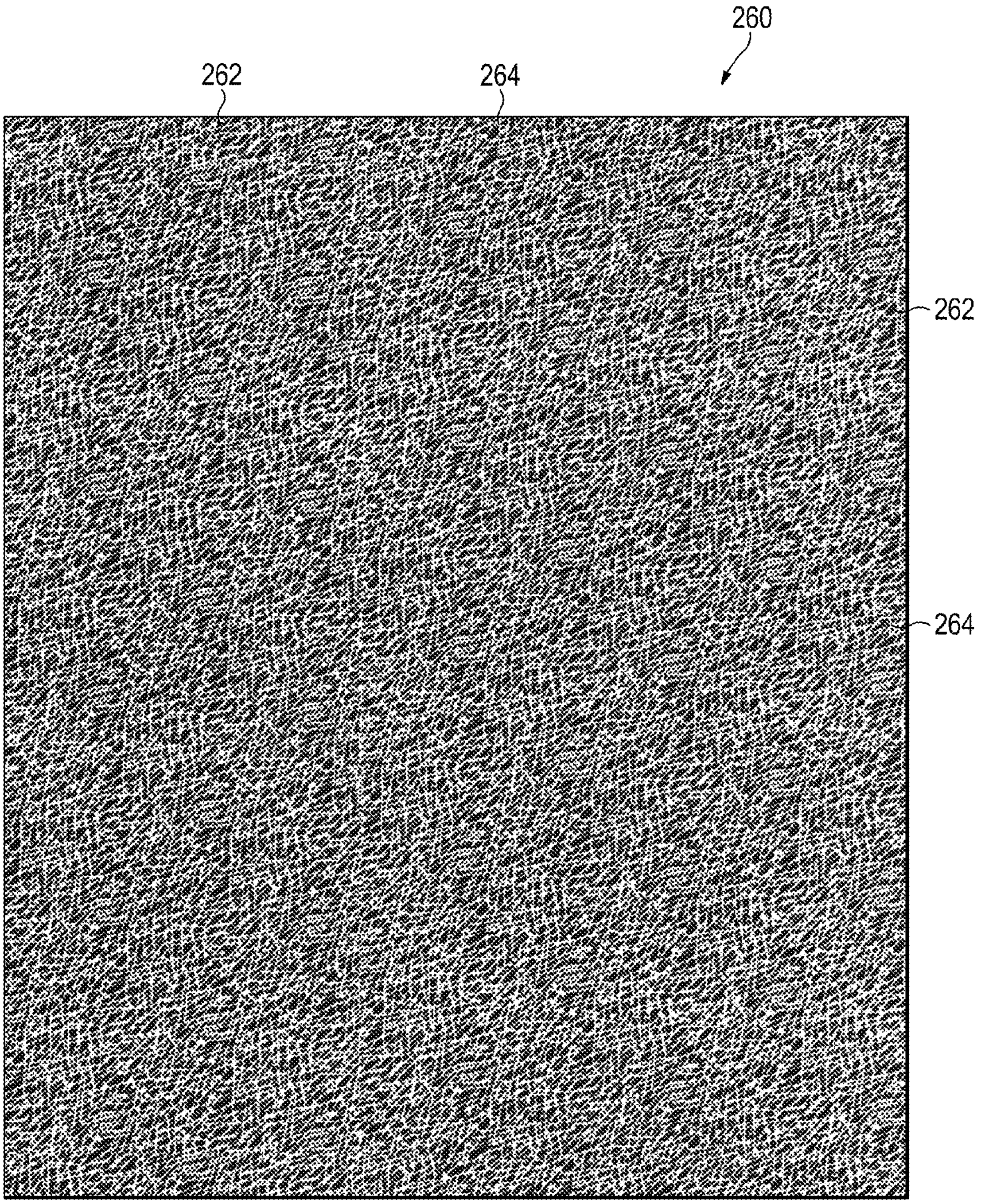
FIGS. 10-12 depict examples of different texture layer patterns.
Figure 11:
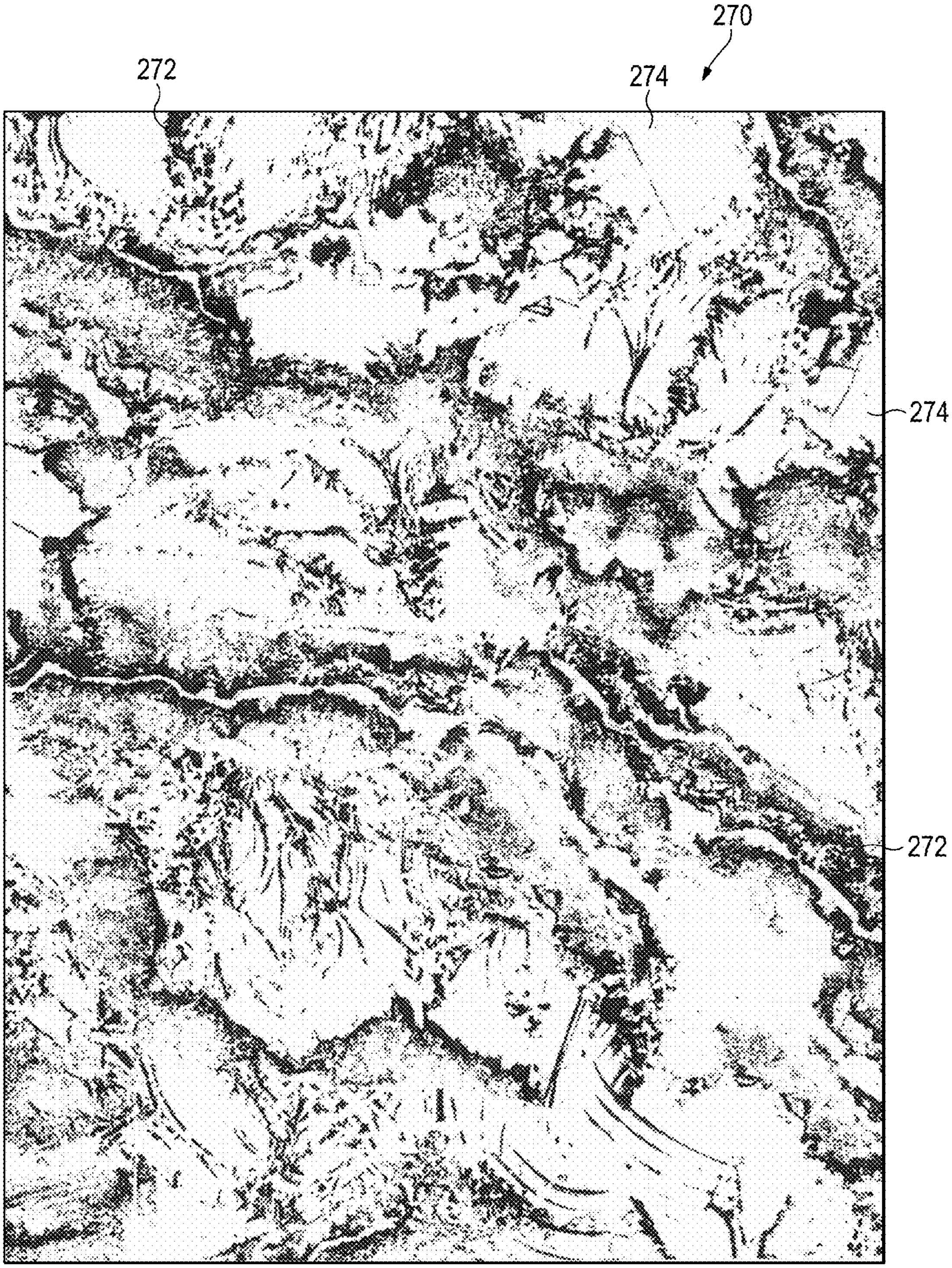
Figure 12:
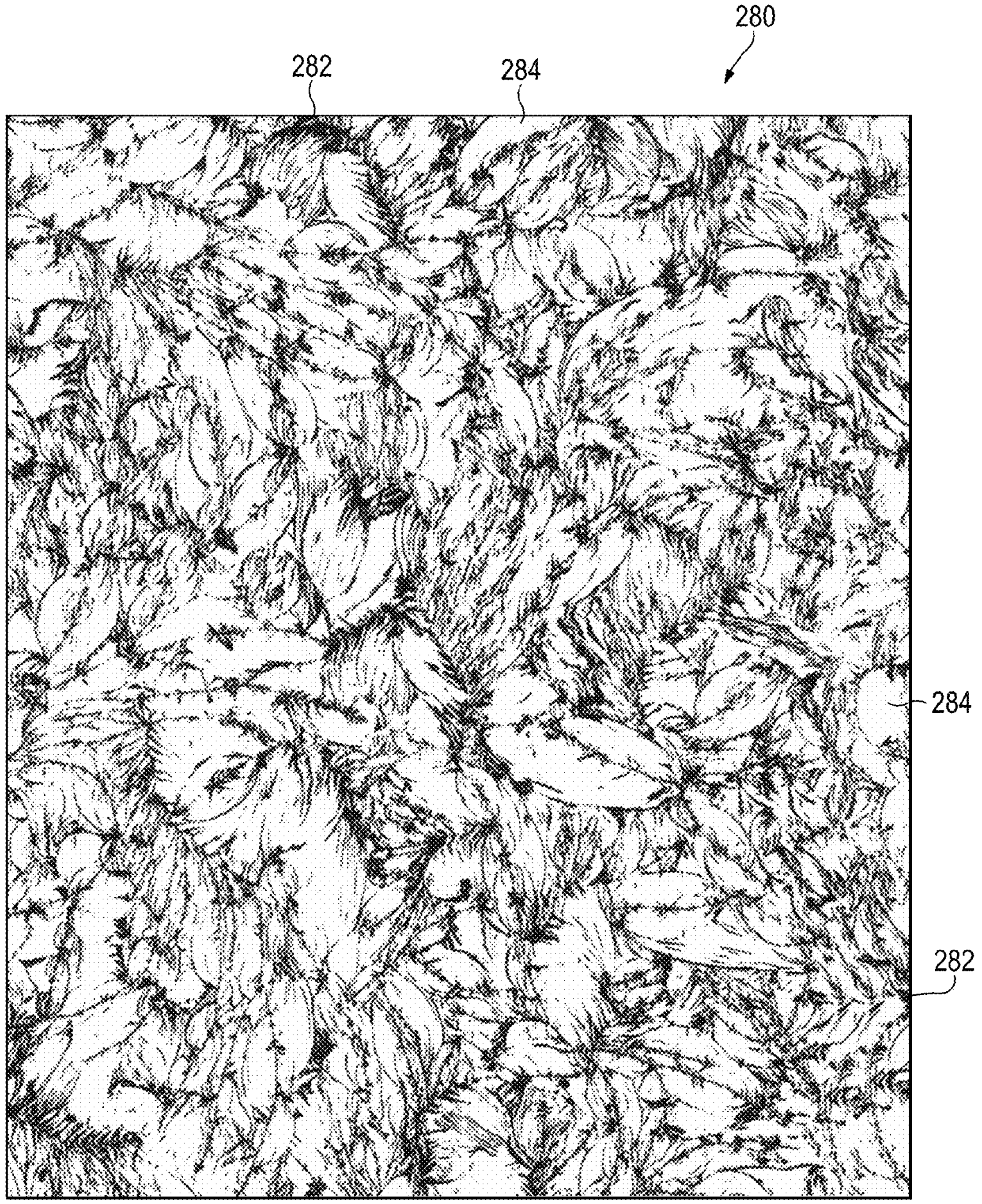

FIGS. 10, 11, and 12 depict examples of different texture layer patterns. FIG. 10 shows a texture layer pattern 260 that may be used either as texture layer 130 and/or texture layer 170. In this example, dark areas 262 comprise the raised bumps of resin and white areas 264 comprise spaces between the raised bumps of resin.

As explained above, pattern 260 is formed in areas of a screen using a photosensitive emulsion that is applied as either a liquid coating or in sheet form. Black areas 262 create the openings in the mesh and white areas 264 form covered areas in the mesh. Texture pattern 260 is applied over the emulsion and the emulsion is then exposed to light. Areas in the emulsion covered by dark areas 262 in pattern 260 remain soft and are washed out. Other areas in the emulsion under white areas 264 in pattern 260 remain blocked off with emulsion.

In a next operation, the screen is located over sheet 120 and resin is spread over the screen. Using a squeegee, the resin is spread through the unblocked areas in the screen and onto sheet 120 forming raised bump patterns in dark areas 262 while spaces of no resin remain in blocked off white areas 264. The combination of openings in the mesh within each unblocked area form the bumps. The bumps in texture layer pattern 260 may be as random as possible to further simulate organic materials.

FIG. 11 shows another texture layer pattern 270 that may be used either as texture layer 132 and/or texture layer 170 in tile 100. In this example, dark areas 272 comprise the raised areas of resin and white areas 274 comprise spaces between the raised areas of resin. FIG. 12 shows yet another example texture layer pattern 280 that may be used either as texture layer 132 and/or texture layer 170 in tile 100. In this example, dark areas 282 comprise the raised areas of resin and white areas 284 comprise spaces between the raised areas of resin.

The substantially semi-random texture patterns 260, 270, and/or 280 contribute to the aesthetics of tiles 100. For example, texture patterns 260, 270, and/or 280 may reflect and refract light at different semi-random angles within tiles 100 further increasing 3-D characteristics of images within tiles 100.

Texture patterns 260, 270, and/or 280 also may be offset by different amounts and with different orientations with respect to other texture layer patterns in texture layers 132 or 170 and also may be offset by different amounts and orientations with respect to images 122 and 142 printed onto sheets 120 and 140, respectively. Thus, an almost limitless combination of combined texture patterns and images may be created within tiles 100.

Having described and illustrated the principles of the invention in a preferred embodiment thereof, it should be apparent that the invention may be modified in arrangement and detail without departing from such principles. We claim all modifications and variation coming within the spirit and scope of the following claims.

The invention claimed is:

1. A manufactured decorative covering, comprising:

a first sheet comprising vinyl;

a first ink layer applied over the first sheet, wherein the first ink layer forms a first image;

a textured layer applied onto the first ink layer;

a second sheet comprising vinyl laminated with the first sheet over the textured layer to form a decorative wall tile; and a second ink layer applied over the second sheet, wherein the second ink layer forms a second image randomly aligned with the first image and the textured layer and the second sheet provide a physical spacing between the first link layer and the second ink layer enabling light to pass through the second ink layer and reflect and refract the light in between the first ink layer and the second ink layer and create a 3-dimension visual effect in the wall tile between the first image formed on the first sheet and the overlapping second image formed on the second sheet.

2. The decorative covering of claim 1, including an adhesive laminating the first sheet and the second sheet together, wherein the adhesive and the textured layer are transparent allowing at least some of the light to pass through the second sheet, adhesive, and textured layer enabling viewing of the first image while also reflecting and refracting the light to simulate two non-uniform textures in the first image and second image.

3. The decorative covering of claim 2, further comprising a clear overprint layer comprising resin extending over the textured layer allowing light to pass through the overprint layer and reflect and refract within the textured layer while viewing of the first image.

4. The decorative covering of claim 3, wherein the overprint layer forms a substantially uniform thickness over the textured layer.

5. The decorative covering of claim 3, further comprising an additional textured layer comprising resin formed on top of the overprint, wherein the additional textured layer further increases the spacing between the first and second ink layer, the reflection and refraction of light, and the 3-dimension visual effect in the wall tile between the first image formed on the first sheet and the second image formed on the second sheet.

6. The decorative covering of claim 5, wherein the additional textured layer comprises a plurality of bumps having a variety of different shapes arranged into different patterns, wherein the bumps in the textured layer and the bumps in the additional textured layer each cover some areas of the first sheet while leaving other areas of the first sheet uncovered.

7. The decorative covering of claim 6, further comprising reflective objects interspersed within the additional textured layer, wherein:

the first image simulates a first set of organic materials running through a stone;

the second image simulates a second set of organic materials running through the stone; and the reflective objects create an additional visual contrast and depth variance relative to the first set of organic material running through the stone and the second set of the organic material running through the stone.

8. The decorative covering of claim 6, wherein the reflective objects comprise glitter.

9. The decorative covering of claim 1, further comprising a domed layer of resin formed over the second ink layer.

10. The decorative covering of claim 1, further comprising a first substantially opaque adhesive layer formed on a bottom side of the first sheet and a second substantially transparent adhesive layer formed on a bottom side of the second sheet.

11. A manufactured covering, comprising:

a first sheet of vinyl;

a first ink layer applied onto the first sheet, wherein the first ink layer forms a first image having a first shape;

a textured layer applied onto the first ink layer comprising a substantially flat bottom surface extending up into a semi-random pattern of irregular shaped bumps;

a second sheet of vinyl laminated with the first sheet, wherein the textured layer is laminated to the second sheet in-between the first sheet and the second sheet; and a second ink layer formed on the second sheet forming a second image having a second shape different from the first shape and randomly aligned with the first shape, wherein the second sheet of vinyl and the textured layer are configured to create a spacing and non-uniform texture between the first sheet and the second sheet for increasing light refraction and reflection and creating a 3-dimensional visual effect between the first image and the second image.

12. The covering of claim 11, wherein:

the first image simulates a first type of organic material;

the second image simulates a second type of organic material; and the textured layer simulates a non-uniform depth variance between the first type of organic material simulated by the first image and the second type of organic material simulated by the second image.

13. The covering of claim 11, further comprising an overprint layer comprising resin extending over the textured layer and in between the first and second sheet.

14. The covering of claim 13, wherein the overprint layer forms a substantially uniform thickness over the textured layer.

15. The covering of claim 14, further comprising an additional textured layer comprising resin formed on top of the overprint layer further increasing the spacing between the first sheet and the second sheet, the amount of reflection and refraction of light between the first image and the second image, and the amount of 3-dimensional visual effect between the first image and the second image.

16. The covering of claim 15, wherein the additional textured layer comprises a plurality of bumps having a variety of different shapes arranged into different patterns, wherein the bumps in the textured layer and the bumps in the additional textured layer each cover some areas of the first sheet while leaving other areas of the first sheet uncovered.

17. The decorative covering of claim 15, further comprising reflective objects interspersed within the additional textured layer creating an additional visual contrast and depth variance between the first image and the second image.

18. The decorative covering of claim 17, wherein the reflective objects comprise glitter.

19. The decorative covering of claim 11, further comprising a domed layer of resin formed over the second ink layer.

20. The decorative covering of claim 11, further comprising a first substantially opaque adhesive layer formed on a bottom side of the first sheet and a second substantially transparent adhesive layer formed on a bottom side of the second sheet.

* * * * *